(12) United States Patent
Nelson et al.

(10) Patent No.: US 6,279,878 B1
(45) Date of Patent: Aug. 28, 2001

(54) HIGH TEMPERATURE, HIGH STRAIN PIEZOELECTRIC COMPOSITIONS

(75) Inventors: Jeffrey G. Nelson; Ratnakar R. Neurgaonkar, both of Thousand Oaks, CA (US)

(73) Assignee: Rockwell Technologies, LLC, Thousand Oaks, CA (US)

(*) Notice: Subject to any disclaimer, the term of this patent is extended or adjusted under 35 U.S.C. 154(b) by 0 days.

(21) Appl. No.: 09/561,094

(22) Filed: Apr. 28, 2000

(51) Int. Cl.$^7$ ............... C04B 35/493; C04B 35/499; H01L 41/187

(52) U.S. Cl. ............... 256/62.9 PZ; 501/134; 310/328; 310/534

(58) Field of Search .............. 252/62.9 PZ; 501/134; 310/328, 334

(56) References Cited

U.S. PATENT DOCUMENTS

| 4,367,426 | 1/1983 | Kumada et al. ............ 310/358 |
| 5,378,382 | 1/1995 | Nishimura et al. ............ 252/62.9 |

(List continued on next page.)

FOREIGN PATENT DOCUMENTS

10007460-A * 1/1998 (JP).

OTHER PUBLICATIONS

K. V. Ramana Murty, K. Umakantham, S. Narayana Murty, K. Chandra Mouli and A. Bhanumathi, *Hysteresis Behaviour and Piezoelectric Properties of Nb Doped PLZT Ceramics*, Andhra University, Waltair–530 003 India, pp. 500–502.

K.V. Ramana Murty, S. Narayana Murty, K. Umakantham, and A. Bhanumathi, Andhra University, India and K. Linga Murty, North Carolina State University, U.S.A., Effect of Nb$^{5+}$Substitution on the Piezoelectric Properties of PLZT Ceramics, Ferroelectrics 1991, vol. 1991, pp. 119–122.

(List continued on next page.)

*Primary Examiner*—C. Melissa Koslow
(74) *Attorney, Agent, or Firm*—Koppel & Jacobs; Michael J. Ram

(57) ABSTRACT

PLZT piezoelectric ceramics having the general formula $(Pb_{1-x}La_x)(Zr_yTi_{1-y})_{1-(x/4)-z}M^{a+}_{4z/a}O_3$ are fabricated in a hot forging process using PbO, TiO$_2$, ZrO$_2$, and La$_2$O$_3$ powders with Nb$_2$O$_5$ and Ta$_2$O$_5$ added to provide 2.0–3.0% Nb$^{5+}$ (mole %) and 2.0–3.0% Ta$^{+5}$ (mole %) as a dopant. ZrO$_2$ and TiO$_2$ powders are mixed at a molar ratio of y/(1-y), the preferred molar ratio being 55/45, calcined at approximately 1300° C.–1500° C., ball milled in acetone, and evaporated to a dry powder. The mixture of ZrO$_2$ and TiO$_2$ is then combined with PbO$_2$, La$_2$O$_3$, Nb$_2$O$_5$ and Ta$_2$O$_5$ powders, and the new mixture is ball milled in acetone, evaporated to a dry powder, calcined at approximately 700°–850° C., and sifted to obtain a particle size of approximately 0.5–1.5 μm. The final Nb/Ta-doped PLZT powder is formed into the desired shape by cold pressing followed by sintering at approximately 1000° C.–1150° C. in oxygen. The PLZT ceramic material is further densified to about 98.5% of the material's theoretical maximum density by heating to approximately 1175° C.–1275° C. at 300–1200 psi uniaxial pressure. The resulting high temperature, high performance Nb/Ta-doped PLZT piezoelectric ceramic exhibits an average grain size of about 3 μm, a well-defined polarization hysteresis loop, reduced strain hysteresis with the application of a unipolar electric field, a breakdown strength greater than 25 kV/cm, a linear piezoelectric coefficient (d$_{33}$) of about 790 pC/N, maximum strain greater than 0.16%, and a fatigue life of at least 10$^8$ cycles and a Tc of about 205–208° C.

12 Claims, 1 Drawing Sheet

U.S. PATENT DOCUMENTS

| | | | |
|---|---|---|---|
| 5,595,677 | 1/1997 | Neurgaonkar et al. | 252/62.9 |
| 5,607,632 | 3/1997 | Neurgaonkar et al. | 264/61 |
| 5,914,507 | 6/1999 | Polla et al. | 257/254 |

OTHER PUBLICATIONS

Photochromic Effect in Impurity–Doped PLZT Ceramics, Electronics Letters $22^{nd}$ Aug. 1974 vol. 10 No. 17, pp. 350–351.

R.R. Neurgaonkar, J.R. Oliver and J.G. Nelson, Properties of Dense PLZT Piezoelectrics, Journal of Intelligent Material Systems and Structures, vol. 4—Apr. 1993, pp. 272–275.

* cited by examiner

HIGH TEMPERATURE, HIGH STRAIN PIEZOELECTRIC COMPOSITIONS

The present invention relates to piezoelectric materials and, in particular, to high performance, Nb/Ta-doped PLZT piezoelectric ceramics that are capable of operating at high temperatures without an unacceptable reduction in strain level. This work was performed in whole or in part under a grant from DARPA (G.O. 44004).

BACKGROUND GROUND OF THE INVENTION

The performance of piezoelectric actuators and sensors is dependent on the microstructural properties of the piezoelectric materials. Commercially available piezoelectric materials, including PZT, PLZT, and PMN-PT, typically exhibit good piezoelectric response but poor fatigue life. Attempts have been made in the past to improve the microstructure of piezoelectric materials using fine-grained precursors with conventional sintering techniques. Although such attempts at microstructural improvement have enhanced some piezoelectric performance characteristics, fatigue life remains low because conventionally sintered ceramics typically have densities of only 90–95% of their theoretical values. U.S. Pat. Nos. 5,595,677 and 5,607,632 present new piezoelectric materials with improved grain orientation, greater density, and extended fatigue life and a process for forming these piezoelectric materials. Those new materials comprise a family of Nb-doped PLZT piezoelectric ceramics.

The PLZT ceramics, according to the '677 and '632 patents, are fabricated using PbO, $TiO_2$, $ZrO_2$, and $La_2O_3$ powders as starting materials in a hot forging technique to produce a PLZT piezoelectric ceramic having the general formula $(Pb_{1-x}La_x)(Zr_yTi_{1-y})_{1-(x/4)}O_3$. In the steps of the fabrication method, $ZrO_2$ and $TiO_2$ powders are mixed at a molar ratio of y/(1−y), calcined at approximately 1300° C.–1500° C., and ball milled in acetone. After milling, the acetone is evaporated to produce a dry powder. The mixture of $ZrO_2$ and $TiO_2$ is then combined with appropriate amounts of the PbO and $La_2O_3$ powders plus $Nb_2O_5$ added to provide 0.5–1.5% $Nb^{5+}$ (mole %) as a dopant. The new mixture is ball milled in acetone, evaporated to a dry powder, calcined at approximately 700° C.–850° C., and sifted to obtain a particle size of approximately 0.3–2.0 µm. The final PLZT powder is then formed into the desired shape by cold pressing (typically at 15,000–25,000 pounds, for example) followed by sintering at approximately 1000° C.–1150° C. in oxygen. Further densification may be accomplished by heating to approximately 1175° C.–1275° C. at 800–1200 psi to achieve a density of at least 97% (preferably at least 98.5%) of the material's theoretical maximum density.

The PLZT ceramic materials prepared by the process of the '677 and '632 patent displayed a strong dielectric permittivity maximum at approximately 155° C.–165° C., above and below which the permittivity drops rapidly. The ceramic is a polar dielectric below about 112° C.–125° C. with a stable net spontaneous polarization, $P_r$, and a well-defined polarization hysteresis loop (P versus bipolar electric field). A distinguishing feature of PLZT ceramics made by the process described in U.S. Pat. Nos. 5,595,677 and 5,607,632, compared with other piezoelectric ceramics, is a reduced strain hysteresis with the application of a unipolar electric field and a breakdown strength of greater than 25 kV/cm (typically 25–30 kV/cm), which is well above the typical operating electric field strengths that are normally used for piezoelectric actuation. Furthermore, the linear piezoelectric coefficient ($d_{33}$), the maximum strain (%), and the fatigue life (cycles) of the Nb-doped PLZT piezolectric ceramics is significantly improved over prior known piezoelectric materials. These materials are designed to operate between −50 and +100° C., having high strain properties (0.20%) in this temperature range. However, since these materials have a Curie temperature (Tc) of about 115° C., they can not be used above about 100° C. As a result, they fail to demonstrate suitable piezoelectric properties when operated at higher temperature situations (approximately 200° C.) and therefore can not be used in aircraft, some aerospace and engine environments.

A principal object of the present invention is to provide piezoelectric materials which have improved performance at higher temperatures. Additionally, the Nb/Ta-doped PLZT piezoelectric ceramic incorporating features of the invention have a high density and fine grain microstructure. An advantage of these new PLZT piezoelectric ceramics is that they exhibit a strain rate of approximately 0.17% at ~200° C. while still maintaining a $d_{33}$ of about 800 pC/N.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

Figure 1:
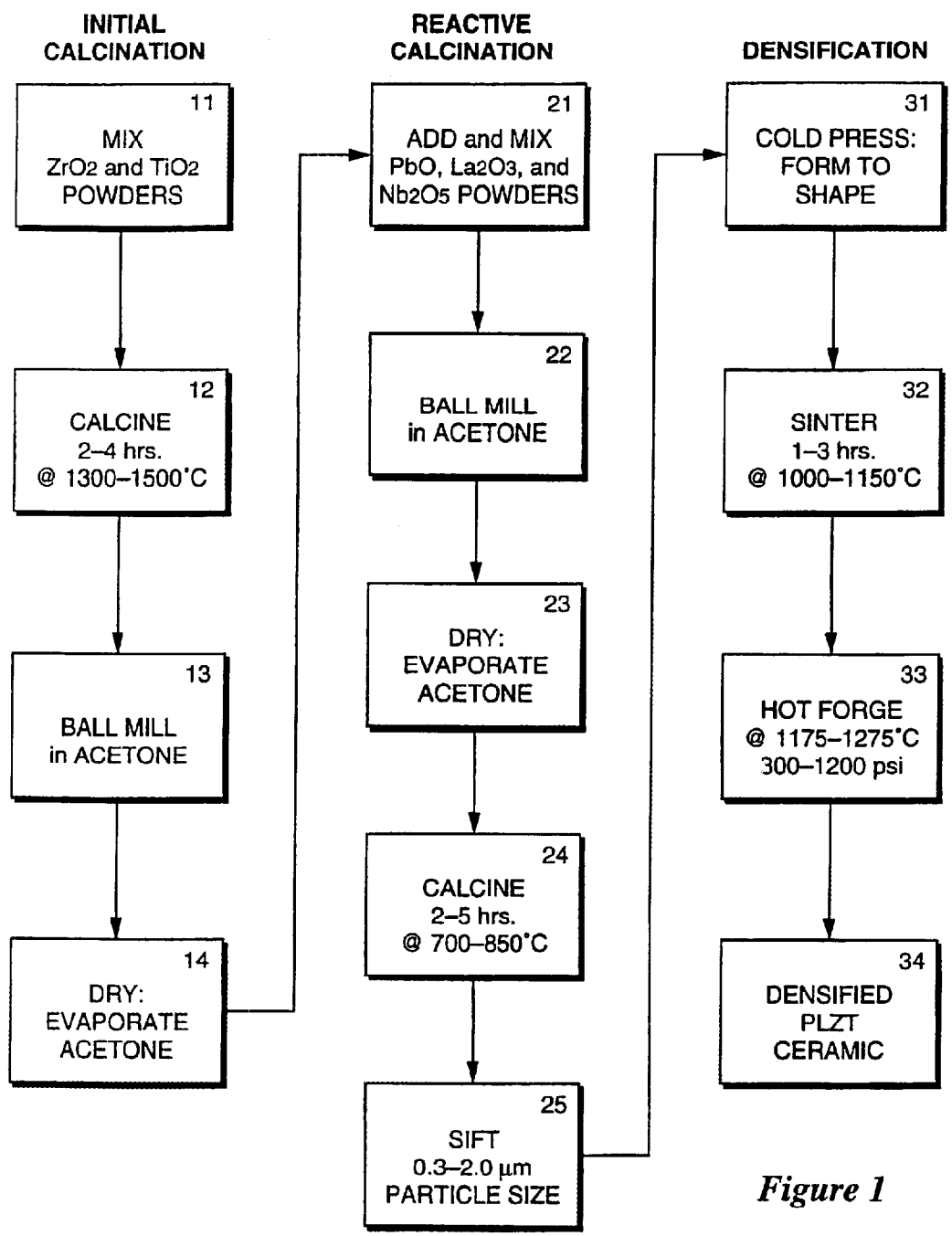
FIG. 1 is a process flow chart for the method of fabricating Nb/Ta-doped PLZT piezoelectric ceramics of the present invention.

The present invention comprises a family of Nb/Ta-doped PLZT high performance piezoelectric ceramics having improved performance characteristics when operated at elevated temperatures. PLZT piezoelectric ceramics of the present invention, have the general formula $(Pb_{1-x}La_x)(Zr_yTi_{1-y})_{1-(x/4)-z}M^{a+}_{4z/a}O_3$. Where x is from about 0.04 to about 0.05, y is from about 0.52 to about 0.58, z is from about 0.04 to about 0.06, and M is a combination of Nb and Ta, $a^+$ being the valence of Nb and Ta respectively. They are fabricated by the hot forging technique described in U.S. Pat. No. 5,607,632 using PbO, $TiO_2$, $ZrO_2$, and $La_2O_3$ powders as starting materials. $Nb_2O_5$ and $Ta_2O_5$ are added to provide 2.0–3.0% $Nb^{5+}$ (mole %) and 2.0–3.0% $Ta^{5+}$ (mole %) as dopants. The resulting materials have an average grain size of about 3 µm, a well defined polarization hysteresis loop, reduced strain hysteresis when a unipolar electric field is applied, a breakdown strength of greater than 26 kV/cm, a linear piezoelectric strain coefficient ($d_{33}$) greater than 700 pC/N, maximum strain greater than 0.15%, a coupling constant ($k_{33}$) of 0.81 and a fatigue life of at least $10^9$ cycles.

The formula of a preferred PLZT composition has lanthanum, zirconium, and tantalum in molar ratios of 4.5, 55, and 45 respectively (4.5/55/45) resulting in $(Pb_{0.955}La_{0.045})(Zr_{0.55}Ti_{0.45})_{0.93875}O_3$ with the Nb and Ta dopants adding an additional 4 to 6 mole %, preferably 2.5 mole % of Nb and 2.5 mole % of Ta. To fabricate a preferred embodiment of this PLZT ceramic, the precursor materials (99.069 gm. PbO, 3.340 gm. $La_2O_3$, 28.893 gm. $ZrO_2$, 15.473 gm. $TiO_2$, 1.211 gm. $Nb_2O_5$, and 2.014 gm. $Ta_2O_5$) are blended together as described.

The first stage of producing the preferred PLZT (4.5/55/45) involves initial reactive calcination of $ZrO_2$ and $TiO_2$ as shown in the first column of FIG. 1. In the method of fabrication, (shown in FIG. 1), $ZrO_2$ and $TiO_2$ powders are mixed at a molar ratio of y/(1−y), the preferred molar ratio being 55/45 (or approximately 65.1/34.9 by weight). The mixture is placed in any suitable closed container, such as a Nalgene bottle, and mixed for about 5 minutes (Step 11) and then transferred to a platinum crucible. The mixture of $ZrO_2$ and $TiO_2$ powders is then calcined at approximately 1300° C.–1500° C. for about 2–4 hours (Step 12). After calcination, the powder mixture is ball milled in acetone for about 40–50 hours (Step 13). After milling, the acetone is evaporated to produce a dry powder (Step 14).

The next stage of the process involves reactive calcination of the PLZT powder mixture, as shown in the second (middle) column of FIG. 1. The calcined and milled mixture of $ZrO_2$ and $TiO_2$ from the first stage of the process is combined with appropriate amounts of, PbO, $La_2O_3$, $Nb_2O_5$ and $Ta_2O_5$ powders, such as indicated in the preferred composition listed (Step 21). The combination of six ingredients is ball milled in acetone for about 40–50 hours (Step 22) and evaporated to a dry powder (Step 23). The powder mixture from Step 23 is then calcined at approximately 700° C.–850° C. for about 2–5 hours (Step 24) and sifted, for example through a screen (Step 25), to produce a powder mixture with a particle size of approximately 0.5–1.5 μm.

The final stage of the process is densification of the Nb/Ta-doped PLZT powder mixture, as shown in the third (right-hand) column of FIG. 1. After the milled and calcined Nb/Ta-doped PLZT powder is formed into a desired shape, such as a 1.5 inch diameter disk comprising about 150 grams of powder, by cold pressing at about 15,000–25,000 pounds (Step 31). The formed shape is then sintered, preferably for about 1–3 hours at approximately 1000° C.–1150° C., (Step 32) to produce a partically-densified Nb/Ta-doped PLZT ceramic. The Nb/Ta-doped PLZT ceramic material can be further densified by hot forging (Step 33) by heating to approximately 1175° C.–1275° C. at 300–1200 psi uniaxial pressure for about 2–5 hours to produce a densified Nb/Ta-doped PLZT ceramic (Step 34). The final product has an average grain size of about 3 μm and a density of at least 97% (preferably at least 98.5%) of the material's theoretical maximum density.

Example properties of Nb/Ta-doped PLZT (4.5/55/45) produced by the foregoing method are listed in Table 1 below. For comparison purposes, also listed are properties for a Nb-doped piezoelectric material made in accordance with the teachings of U.S. Pat. Nos. 5,595,677 and 5,607,632.

TABLE 1

| Property | INVENTION Range | INVENTION Mean | Prior Art* |
|---|---|---|---|
| Ferroelectric Transition, $T_c$ (° C.) | 196–218 | 208 | 112 |
| Dielectric Constant, $\epsilon$ | 3450–3720 | 3650 | 4650 |
| Coupling Constant, $k_{33}$ | 0.75–0.83 | 0.81 | 0.85 |
| Spontaneous Polarization, $P_r$ (μC/cm²) | 31.0–34.5 | 33.0 | 30.0 |
| Electrostriction Constant, $Q_{33}$ (m⁴/C²) | 0.036–0.041 | 0.0404 | 0.0385 |
| Hysteresis (%) | 11–14 | 12 | 12 |
| Piezoelectric Strain Coef., $d_{33}$ (pC/N) | 725–820 | 790 | 950 |
| Maximum Strain, $S_{33}$, % @ 20 kV/cm | 0.16–0.18 | 0.17 | 0.20 |
| Fatigue Life, cycles | $10^8$–$10^{10}$ | >$10^9$ | $10^{10}$ |

*U.S. Pat. Nos. 5,595,677 and 5,607,632

While some commercially available materials may have a high Tc (375° C.), certain properties of these materials are less than desirable. For example, piezoelectric strain coefficient is less than 50% of the Nb/Ta-doped material, the dielectric constant is about 2500, $k_{33}$, which is a measure of the efficiency of conversion of mechanical to electrical energy, of the commercial materials is about 20% less, hysteresis is about 50% greater and the maximum strain is typically about 0.10% @2 kV/cm. Typically, with a higher Tc, $d_{33}$ and $S_{33}$ are reduced. However, it was found that by reducing the La concentration, increasing the Nb concentration and adding Ta the desirable properties value could be enhanced. Therefore, in contrast to prior materials, the Nb/Ta-doped PLZT (4.5/55/45) ceramic material fabricated using the foregoing method displays a strong dielectric-permitivity maximum at approximately 200–215° C., Nb/Ta-doped PLZT (4.5/55/45) becomes a polar dielectric below about 205–208° C., which is much higher than the prior art materials made by the same process, while still exhibiting a stable net spontaneous polarization, $P_r$, and a well-defined, small polarization hysteresis loop (P versus bipolar electric field). Similar to the prior art Nb-doped PLZT ceramics, Nb/Ta-doped PLZT ceramics of the present invention also have reduced strain hysteresis with the application of a unipolar electric field. In addition, the breakdown strength of these PLZT ceramic materials is greater than about 30 kV/cm (generally 28–32 kV/cm), comparable to the typical operating electric field strengths that are normally exhibited by piezoelectric actuation of materials which can not operate at the higher temperatures. Furthermore, the Nb/Ta-doped PLZT ceramic materials of the present invention do not show a degradation in operating properties, including linear piezoelectric coefficient ($d_{33}$), maximum strain (%), and fatigue life (cycles) when operated at temperatures up to about 200° C.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

What is claimed is:

1. A piezoelectric material, comprising:
   a PLZT material having the general formula $(Pb_{0.955}La_{0.045})(Zr_{0.55}Ti_{0.45})_{0.93875}O_3$,
   said PLZT material doped with from about 2 mole % to about 3 mole % $Nb^{5+}$ and
   from about 2 mole % to about 3 mole % $Ta^{5+}$, and said PLZT material having an average grain size of about 3 μm, a maximum piezoelectric strain in the range of 0.16–0.18% and a $T_c$ of from about 196 to 218° C.

2. The piezoelectric material of claim 1 wherein the Tc is from about 205 to about 208° C.

3. The piezoelectric material of claim 2, wherein said Nb/Ta-doped PLZT material has a fatigue life from about $10^8$ to about $10^{10}$ cycles.

4. The piezoelectric material of claim 3, wherein said Nb/Ta-doped PLZT material has a density at least 98.5% of the material's theoretrical maximum density.

5. The piezoelectric material of claim 1, wherein said Nb/Ta-doped PLZT material has a breakdown strength of at least 30 kV/cm.

6. The piezoelectric material of claim 2, wherein said PLZT material has a linear piezoelectric coefficient ($d_{33}$) in the range of 725–820 pC/N.

7. A high temperature, high density piezoelectric material, comprising:
   a PLZT material having the general $(Pb_{0.955}La_{0.045})(Zr_{0.55}Ti_{0.45})_{0.93875}O_3$;

said PLZT material doped with about 2 mole % to about 3 mole % $Nb^{5+}$ and about 2 mole % to about 3 mole % $Ta^{5+}$, said PLZT material having an average grain size of about 3.0 μm, a density of at least 98.5% of the material's theoretical maximum density, and a fatigue life from about $10^8$ to about $10^{10}$ cycles; said PLZT material having a linear piezoelectric coeffcient ($d_{33}$) in the range of 725–820 pC/N, a maximum piezoelectric strain in the range of 0.16–0.18%, and a breakdown strength of at least 30 kV/cm, said PLZT piezoelectric material capable of operating at temperatures up to about 200° C.

8. A high temperature piezoelectric actuator material, comprising:

a PLZT material having the general $(Pb_{0.955}La_{0.445})(Zr_{0.55}Ti_{0.45})_{0.93875}O_3$;

said PLZT material being doped with 2.0–3.0 mole % $Nb^{5+}$ and 2.0–3.0 mole % $Ta^{5+}$; and having an average grain size of about 3 μm, a density of at least 98.5% of the material's theoretical maximum density, and a maximum piezoelectric strain in the range of 0.16–0.18%.

9. The piezoelectic actuator material of claim 8, wherein said Nb/Ta-doped PLZT material has a fatigue life from about $10^8$ to about $10^{10}$ cycles.

10. The piezoelectric actuator material of claim 8, wherein said Nb/Ta-doped PLZT material has a linear piezoelectric coefficient ($d_{33}$) in the range of 725–820 pC/N.

11. The piezoelectric actuator material of claim 8, wherein said Nb/Ta-doped PLZT material has a breakdown strength of at least 30 kV/cm.

12. A piezolelectric material having the formula $$(Pb_{1-x}La_x)(Zr_yTi_{1-y})_{1-(x/4)-z-w}Nb_{4w/5}Ta_{4z/5}O_3$$

Where x=0.04 to 0.05 y=0.52 to 0.58 z=0.02 to 0.03 w=0.02 to 0.03 and z+w=0.04 to 0.06.

* * * * *